(12) United States Patent
Sheredy et al.

(10) Patent No.: US 9,898,212 B1
(45) Date of Patent: *Feb. 20, 2018

(54) METHOD AND APPARATUS FOR SELECTING A MEMORY BLOCK FOR WRITING DATA, BASED ON A PREDICTED FREQUENCY OF UPDATING THE DATA

(71) Applicant: Marvell International Ltd., Hamilton (BM)

(72) Inventors: Joseph Sheredy, San Jose, CA (US); Lau Nguyen, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 15/400,154

(22) Filed: Jan. 6, 2017

Related U.S. Application Data

(63) Continuation of application No. 15/005,580, filed on Jan. 25, 2016, now abandoned, which is a continuation of application No. 13/945,700, filed on Jul. 18, 2013, now Pat. No. 9,244,834, which is a continuation of application No. 13/416,678, filed on Mar. 9, 2012, now Pat. No. 8,495,320, which is a continuation of application No. 13/113,236, filed on May 23, 2011, now Pat. No. 8,135,913, which is a continuation of application No. 12/507,548, filed on Jul. 22, 2009, now Pat. No. 7,948,798.

(51) Int. Cl.
*G06F 3/06* (2006.01)
*G11C 16/16* (2006.01)
*G11C 16/34* (2006.01)
*G11C 11/56* (2006.01)

(52) U.S. Cl.
CPC ............ *G06F 3/0616* (2013.01); *G06F 3/064* (2013.01); *G06F 3/0679* (2013.01); *G11C 11/5635* (2013.01); *G11C 16/16* (2013.01); *G11C 16/3495* (2013.01)

(58) Field of Classification Search
CPC .............. G11C 11/5628; G11C 16/349; G11C 2211/5641; G11C 16/16; G11C 16/3496; G11C 11/5635; G06F 12/0246; G06F 2212/7211; G06F 3/0616; G06F 3/064; G06F 3/0679
See application file for complete search history.

(56) References Cited

U.S. PATENT DOCUMENTS

7,532,511 B2  5/2009  Conley et al.
7,702,864 B2  4/2010  Andre et al.
(Continued)

*Primary Examiner* — Hiep Nguyen (57) ABSTRACT

Some of the embodiments of the present disclosure provide a method for programming a flash memory having a plurality of memory blocks, wherein each memory block of the plurality of memory blocks is either a single-level cell (SLC) memory block or a multi-level cell (MLC) memory block, the method comprising assigning a weighting factor to each memory block of the plurality of memory blocks based on whether the memory block is an SLC memory block or an MLC memory block, tracking a number of write-erase cycles for each memory block, and selecting one or more memory blocks for writing data based at least in part on the weighting factor and the tracked number of write-erase cycles of each memory block of the plurality of memory blocks. Other embodiments are also described and claimed.

20 Claims, 9 Drawing Sheets

(56) References Cited

U.S. PATENT DOCUMENTS

| | | |
|---|---|---|
| 7,948,798 B1 * | 5/2011 | Sheredy .............. G11C 11/5628 |
| | | 365/185.03 |
| 7,975,105 B1 | 7/2011 | Sun et al. |
| 8,015,346 B2 * | 9/2011 | Chen ................... G06F 12/0246 |
| | | 365/185.03 |
| 8,566,549 B1 | 10/2013 | Burke et al. |
| 2005/0024941 A1 | 2/2005 | Lasser et al. |
| 2007/0061502 A1 | 3/2007 | Lasser et al. |
| 2007/0156998 A1 | 7/2007 | Gorobets |
| 2008/0104309 A1 | 5/2008 | Cheon et al. |
| 2008/0126680 A1 | 5/2008 | Lee et al. |
| 2008/0215800 A1 | 9/2008 | Lee et al. |
| 2009/0043831 A1 | 2/2009 | Antonopoulos et al. |
| 2009/0113112 A1 | 4/2009 | Ye et al. |
| 2009/0132778 A1 | 5/2009 | Danilak |
| 2009/0193184 A1 | 7/2009 | Yu et al. |
| 2010/0115183 A1 | 5/2010 | Araki et al. |
| 2010/0153616 A1 | 6/2010 | Garratt |
| 2013/0132638 A1 | 5/2013 | Horn et al. |
| 2013/0254458 A1 | 9/2013 | Pittelko |
| 2015/0026387 A1 | 1/2015 | Sheredy et al. |

* cited by examiner

Fig. 1

| Memory Block Identification | Number of write – erase cycles |
|---|---|
| Memory block 1 | 4,000 |
| ⋮ | |
| Memory block H | 5,000 |

| | Memory Block Number | Number of cycles | Weighting factor |
|---|---|---|---|
| Row 1 → | SLC memory block 1 | | 1 |
| Row 2 → | SLC memory block 2 | | 1 |
| | ⋮ | | ⋮ |
| Row N → | SLC memory block N | | 1 |
| Row (N+1) → | MLC memory block 1 | | 10 |
| Row (N+2) → | MLC memory block 2 | | 10 |
| | ⋮ | | ⋮ |
| Row (N+M) → | MLC memory block M | | 10 |

| Memory Block Number | Number of cycles | Weighting factor | Weighted number of cycles |
|---|---|---|---|
| SLC memory block 1 | 2000 | 1 | 2000 |
| SLC memory block 2 | 2100 | 1 | 2100 |
| ⋮ | ⋮ | ⋮ | |
| SLC memory block N | 2010 | 1 | 2010 |
| MLC memory block 1 | 205 | 10 | 2050 |
| MLC memory block 2 | 201 | 10 | 2010 |
| ⋮ | ⋮ | ⋮ | |
| MLC memory block M | 210 | 10 | 2100 |

Row 1 → SLC memory block 1
Row 2 → SLC memory block 2
Row N → SLC memory block N
Row (N+1) → MLC memory block 1
Row (N+2) → MLC memory block 2
Row (N+M) → MLC memory block M

324 — Assigning weighting factors to individual memory blocks of a plurality of memory blocks 328 — Tracking a number of write – erase cycles that each of the plurality of memory blocks has undergone 332 — Selecting one or more memory blocks for writing data, based at least in part on the assigned weighting factor and the tracked number of write – erase cycles of individual memory blocks of the plurality of memory blocks

METHOD AND APPARATUS FOR SELECTING A MEMORY BLOCK FOR WRITING DATA, BASED ON A PREDICTED FREQUENCY OF UPDATING THE DATA

CROSS-REFERENCE TO RELATED APPLICATIONS

The present disclosure is a continuation of and claims priority to U.S. patent application Ser. No. 15/005,580, filed Jan. 25, 2016, which is a continuation of and claims priority to U.S. patent application Ser. No. 13/945,700, filed Jul. 18, 2013, now U.S. Pat. No. 9,244,834, issued Jan. 26, 2016, which is a continuation of and claims priority to U.S. patent application Ser. No. 13/416,678, filed Mar. 9, 2012, now U.S. Pat. No. 8,495,320, issued Jul. 23, 2013, which is a continuation of U.S. patent application Ser. No. 13/113,236, filed May 23, 2011, now U.S. Pat. No. 8,135,913, issued Mar. 13, 2012, which is a continuation of U.S. patent application Ser. No. 12/507,548, filed Jul. 22, 2009, now U.S. Pat. No. 7,948,798, issued May 24, 2011, which are incorporated herein by reference.

TECHNICAL FIELD

The present disclosure relates to storage devices, and more particularly, to mixed multi-level cell and single level cell storage devices.

BACKGROUND

Flash memories are widely used in numerous applications. A conventional flash memory permits a group of memory cells or a memory block to be simultaneously programmed (e.g., written) and/or erased through a single operation. Data may be written to and/or erased from a memory cell for a finite number of times. A flash memory usually has a large number of memory blocks, and if data is written to and/or erased from memory cells of one or more specific group of memory blocks repeatedly, those memory blocks may wear out relatively faster. Thus, it may be desirable that data be distributed evenly across all the memory blocks of a memory. In this way, no single memory block or a group of memory blocks may prematurely fail due to a high number of write and/or erase cycles. This process decreases the total wear on the memory, thereby increasing the lifetime of the memory. A wear-leveling table is usually used to determine the memory blocks to which data is to be written, so that the number of write and erase cycles are almost evenly distributed across all memory blocks of a memory.

Figure 1:
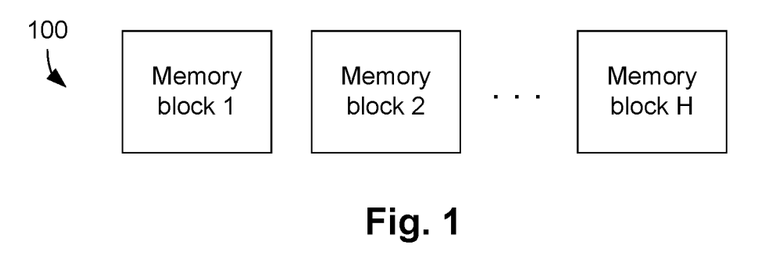
FIG. 1 schematically illustrates an exemplary memory module that includes a plurality of memory blocks.
Figure 2:
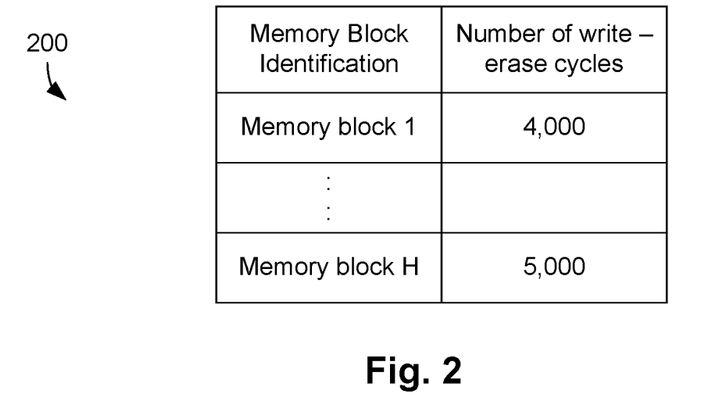
FIG. 2 illustrates an exemplary wear-leveling table associated with the memory module of FIG. 1.

FIG. 1 schematically illustrates an exemplary memory module 100 that includes a plurality of memory blocks 1, . . . , H. Each of the memory blocks 1, . . . , H includes one or more memory cells. FIG. 2 illustrates an exemplary wear-leveling table 200 associated with the memory module 100. Each row of the wear-leveling table 200 is associated with a corresponding memory block of FIG. 1, and includes the memory block identification number and a number of times the memory block (e.g., one or more cells of the memory block) has undergone data write-erase cycles. For example, the first row of the wear-leveling table 200 illustrates that memory block 1 of FIG. 1 has undergone 4,000 write-erase cycles. That is, data has been written to and/or erased from one or more memory cells of the memory block 1 for 4,000 times. Similarly, the last row of the wear-leveling table 200 illustrates that memory block H of FIG. 1 has undergone 5,000 write-erase cycles. Accordingly, if new data has to be written to the memory module 100, the new data may be written preferably in memory block 1 instead of memory block H (or a memory block that has undergone a lower (e.g., the lowest) number of write-erase cycles), so that the number of write-erase cycles is almost evenly distributed across the memory blocks.

Flash memories usually store data in individual memory cells, and the memory cells are usually made of floating-gate transistors. In a single-level cell (SLC) flash memory, one bit of data is stored in each cell. A multi-level cell (MLC) flash memory, on the other hand, stores more than one bit of data in each cell, with the "multi-level" referring to the multiple levels of electrical charge used to store multiple bits per memory cell.

SLC cells usually have relatively faster transfer speed and lower power consumption than MLC cells. However, as SLC cells store less data per cell, cost per megabyte of SLC storage is usually more (e.g., around three times) than MLC storage.

Also, SLC cells may withstand a larger number of write and/or erase cycles as compared to MLC cells. For example, a typical SLC cell may withstand about 100,000 erase-write cycles on an average before wear begins to deteriorate the integrity of the storage, whereas a typical MLC cell may withstand about 10,000 write and/or erase cycles.

SUMMARY

In various embodiments, the present disclosure provides a method for programming a flash memory having a plurality of memory blocks, wherein each memory block of the plurality of memory blocks is either a single-level cell (SLC) memory block or a multi-level cell (MLC) memory block, the method comprising assigning a weighting factor to each memory block of the plurality of memory blocks, the weighting factor being assigned to each memory block based at least in part on whether the memory block is an SLC memory block or an MLC memory block, tracking a number of write-erase cycles for each memory block of the plurality of memory blocks, and selecting one or more memory blocks for writing data based at least in part on the weighting factor and the tracked number of write-erase cycles of each memory block of the plurality of memory blocks.

There is also provided, in accordance with various embodiments of the present disclosure, a memory system comprising a flash memory device comprising a plurality of memory blocks, wherein each memory block of plurality of memory blocks is either a single-level cell (SLC) memory block or a multi-level cell (MLC) memory block, and a memory controller configured to assign a weighting factor to each memory block of the plurality of memory blocks, the weighting factor being assigned to each memory block based at least in part on whether the memory block is an SLC memory block or an MLC memory block, track a number of write-erase cycles for each memory block of the plurality of memory blocks, and select one or more memory blocks for writing data, based at least in part on the weighting factor and the tracked number of write-erase cycles of each memory block of the plurality of memory blocks.

There is also provided, in accordance with various embodiments of the present disclosure, a cache system configured to be operatively coupled to a memory module comprising a plurality of memory blocks, wherein each memory block of the plurality of memory blocks is either a single-level cell (SLC) memory block or a multi-level cell (MLC) memory block, the cache system comprising a memory cache, and a cache controller configured to update, one or more times, one or more information units stored in the memory module, track a frequency of updating of individual information units, categorize individual information units based on the tracked frequency of updating, and determine, for each information unit, whether the information unit is to be written to an SLC memory block or to an MLC memory block based at least in part on such categorizing.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 4b illustrates an exemplary frequency table included in the cache system of FIG. 4a.

FIG. 5 illustrates an exemplary method for operating the system of FIG. 4a.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 3A:
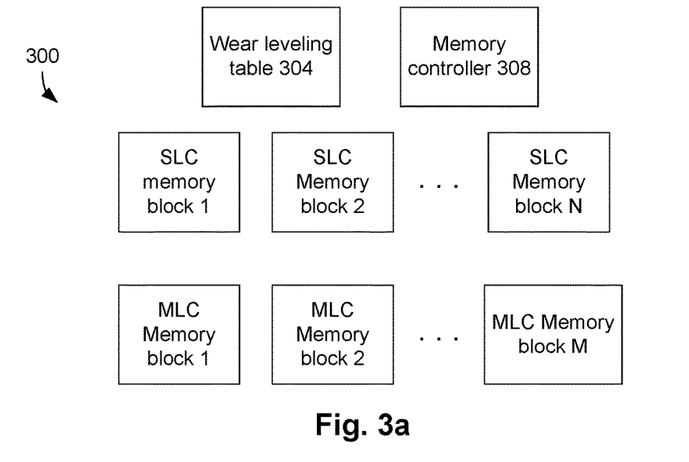
FIG. 3a schematically illustrates an exemplary memory module that includes a plurality of memory blocks.

FIG. 3a schematically illustrates an exemplary memory module 300 that includes a plurality of memory blocks. In an embodiment, the memory module 300 is an electrically erasable programmable read only memory (EEPROM), such as a flash memory.

The plurality of memory blocks of FIG. 3a includes a plurality of SLC memory blocks 1, ..., N, and a plurality of MLC memory blocks 1, ..., M. In an embodiment, each of the SLC memory blocks 1, ..., N includes one or more SLC memory cells, and each of the MLC memory blocks 1, ..., M includes one or more MLC cells. The memory blocks (SLC and/or MLC memory blocks) may be formed (i.e., the cells of individual memory block may be grouped) based on, for example, type, configuration, location, clustering, fragmentation of the memory cells, and/or any other appropriate memory cell grouping criteria.

The numbers N and M are exemplary in nature, and different numbers of SLC and/or MLC memory blocks are also possible. Although in FIG. 3a all the SLC memory blocks are illustrated to be located in a first row and all the MLC memory blocks in a second row, such an arrangement is exemplary in nature, and any other appropriate arrangement of the memory blocks is possible.

The memory module 300 also includes a wear-leveling table 304 and a memory controller 308 configured to control one or more operations of the memory module 300, as will be discussed in more detail herein.

Figure 3B:
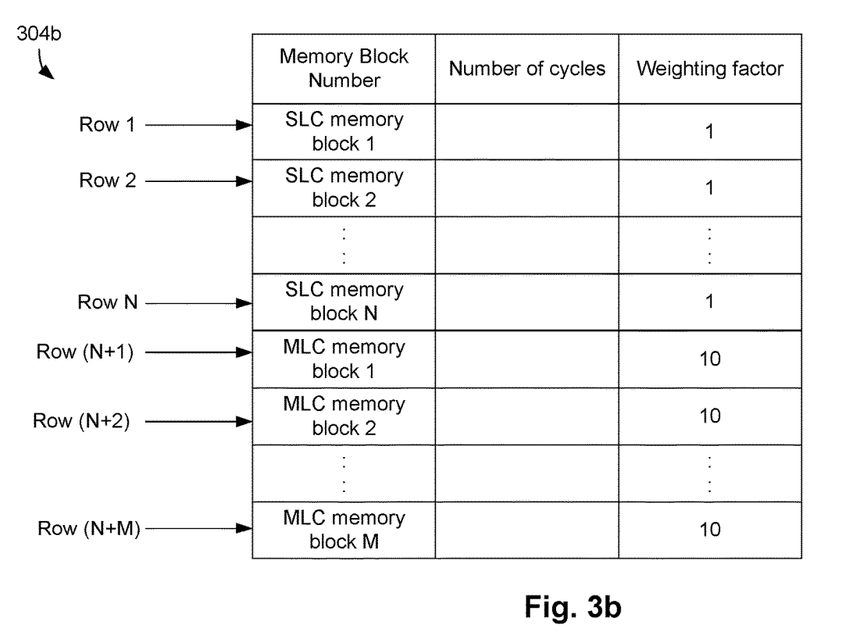
FIG. 3b illustrates an exemplary wear-leveling table.

FIG. 3b illustrates an exemplary wear-leveling table 304b that, in one embodiment, is included in the memory module 300 of FIG. 3a. That is, wear-leveling table 304b of FIG. 3b is an exemplary embodiment of the wear-leveling table 304 of FIG. 3a. Individual rows of the wear-leveling table 304b are associated with corresponding memory blocks of FIG. 3. For example, each of the first N rows of the wear-leveling table 304b is associated with a corresponding SLC memory block, and each of the rows (N+1) through (N+M) of the wear-leveling table 304b is associated with a corresponding MLC memory block.

Although the first N rows of the wear-leveling table 304b is illustrated to be associated with SLC memory blocks, and the next M rows is illustrated to be associated with MLC memory blocks, other arrangements of the rows may also be possible. For example, rows associated with SLC and MLC memory blocks may be interleaved, or arranged in a pseudo-random, random, or in any other appropriate manner. For example, the first row of the wear-leveling table 304b may be associated with an MLC memory block, the second and third row with two respective SLC memory blocks, the fourth row with another MLC memory block, and so on.

Individual rows of the wear-leveling table 304b includes an identification of the memory block with which the row is associated, and also includes a number of write-erase cycles one or more memory cells of the memory block has undergone. In an embodiment, the number of write-erase cycles are updated on a real time basis. That is, as and when data is written to one or more memory blocks, the wear-leveling table 304b is updated. Thus, the wear-leveling table 304b keeps track of a number of write-erase cycles each of the plurality of memory blocks of the memory module 300 has undergone.

As previously discussed, MLC cells typically withstand a relatively smaller number of write-erase cycles as compared to SLC cells. Thus, instead of aiming to evenly distribute data across all memory blocks of the memory module 300, it may be desirable to write data less often in one or more of the MLC memory blocks 1, . . . , M, as compared to one or more of the SLC memory blocks 1, . . . , N. That is, it may be desirable to skew the data distribution of the memory blocks of FIG. 3a such that the SLC memory blocks, on an average, undergoes more number of write-erase cycles compared to MLC memory blocks. This may ensure that all the memory blocks wear at a same rate over time, and may increase an overall life of the memory module 300.

Referring again to FIG. 3b, each row of the wear-leveling table 304b also includes a weighting factor associated with a corresponding memory block. In an embodiment, the weighting factor of a memory block is approximately inversely proportional to an average number of write-erase cycles the memory block may withstand before wear begins to deteriorate the integrity of memory cells in the memory block. For example, as discussed above, SLC memory cells of SLC memory blocks may usually withstand, on an average, a greater number of write-erase cycles as compared to MLC memory cells of MLC memory blocks. Accordingly, MLC memory blocks have relatively higher weighting factors compared to weighting factors associated with SLC memory blocks. In the exemplary wear-leveling table 304b, the weighting factor of each SLC memory block is 1, whereas the weighting factor of each MLC memory block is 10. However, other values of the weighting factors are also possible. In an embodiment, the ratio of the weighting factors of SLC memory blocks and the weighting factors of MLC weighting blocks is almost proportional to the ratio of the average number of write-erase cycles an average MLC memory cell and an average SLC memory cell withstands.

The weighting factors determine how data is distributed among the plurality of memory blocks. Memory blocks with relatively higher weighting factors are configured to undergo a fewer number of write-erase cycles as compared to memory blocks with relatively lower weighting factors. That is, instead of evenly writing data across all the memory blocks (as was the case with the wear—leveling table 200 of FIG. 2), the wear—leveling table 304b is configured to skew the data distribution across the memory blocks based at least in part on the weighting factors corresponding to the memory blocks. Thus, for the exemplary wear—leveling table 304b, each SLC memory block, on an average, undergoes 10 times more write-erase cycles as compared to MLC memory blocks. This ensures that the SLC memory blocks and the MLC memory blocks undergo wear at substantially the same rate over time. For example, by the time individual SLC memory blocks undergo about 100,000 write-erase cycles, individual MLC memory blocks undergo about 10,000 write-erase cycles, and therefore all the memory blocks of FIG. 3a reach an expected life expectancy (which is, for example, about 100,000 cycles for SLC memory blocks and about 10,000 cycles for MLC memory blocks) at about the same time.

Figure 3C:
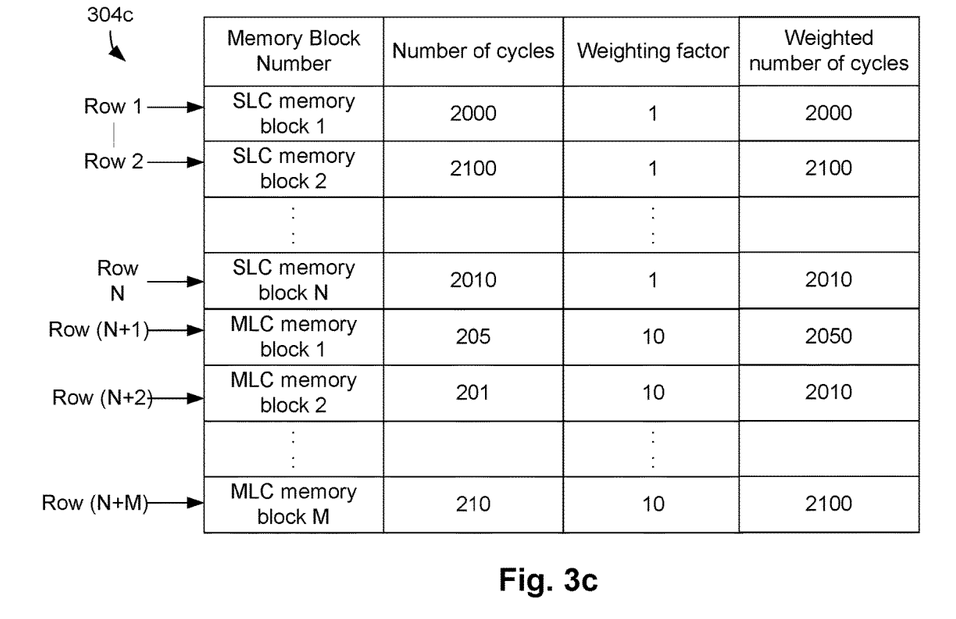
FIG. 3c illustrates another exemplary wear-leveling table.

FIG. 3c illustrates another exemplary wear-leveling table 304c. The wear-leveling table 304c of FIG. 3c is an exemplary embodiment of the wear-leveling table 304 of FIG. 3a. The wear-leveling table 304c is at least in part similar to the wear-leveling table 304b of FIG. 3b, and each row of wear-leveling table 304c includes identification of corresponding memory block, number of write-erase cycles that the memory block has undergone, and a weighting factor corresponding to the memory block. In addition, each row of the wear-leveling table 304c also includes a weighted number of write-erase cycles that the memory block has undergone, wherein the weighted number of write-erase cycles for each memory block is a function of the number of write-erase cycles the memory block has undergone and the weighting factor of the memory block. For example, (in one implementation) the weighted number of write-erase cycles of a memory block is determined by multiplying the number of write-erase cycles undergone with the assigned weighting factor of the memory block.

FIG. 3c also illustrates a few exemplary values of the number of write-erase cycles some of the memory blocks has so far undergone. For example, SLC memory block 1 has undergone 2000 write-erase cycles, whereas MLC memory block 2 has undergone 201 write-erase cycles. These values result in a weighted number write-erase cycles of 2000 for the SLC memory block 1 and 2010 for MLC memory block 2.

In an embodiment, selection of one or more of the memory module 300 in which data is to be written is based at least in part on the weighted number of write-erase cycles of individual memory blocks. For example, data may be written to memory blocks with relatively lower value of the weighted number of write-erase cycles, such that the weighted number of write-erase cycles is almost evenly distributed across the memory blocks of the memory module 300.

Figure 3D:
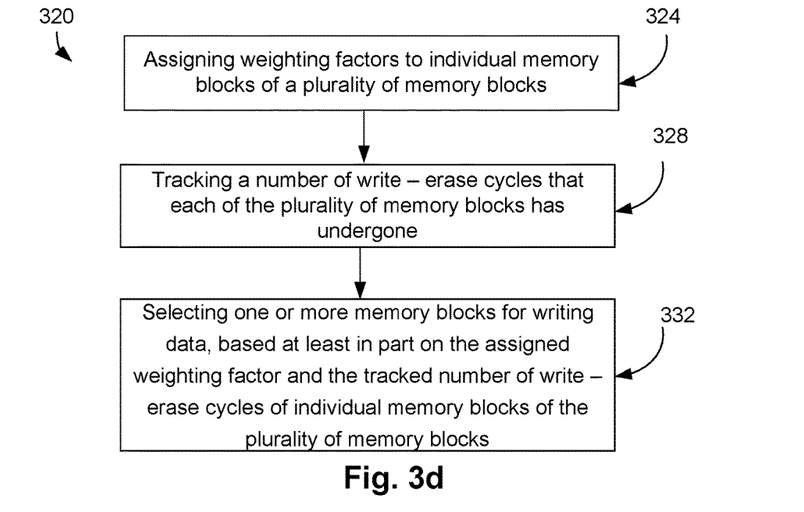
FIG. 3d illustrates an exemplary method for selecting one or more memory blocks into which data will be written.

FIG. 3d illustrates an exemplary method 320 for selecting one or more memory blocks into which data will be written. In an embodiment, the method 320 includes, at block 324, assigning a weighting factor to individual memory blocks of the plurality of memory blocks, based at least in part on a type of the memory block—e.g., whether the memory block is an SLC memory block or an MLC memory block, as illustrated in the wear—leveling tables 304b and 304c of FIGS. 3b and 3c, respectively.

The method 320 further includes, at block 328, tracking a number of write-erase cycles that each of the plurality of memory blocks has undergone. In one implementation, the tracking is done in real time using, e.g., wear-leveling tables 324b and/or 324c, and the wear-leveling table is updated each time one or more memory cells in a memory block undergoes a write-erase cycle.

The method 320 further includes, at block 332, selecting one or more memory blocks for writing data, based at least in part on the assigned weighting factor and the tracked number of write-erase cycles of individual memory blocks of the plurality of memory blocks.

Figure 3E:
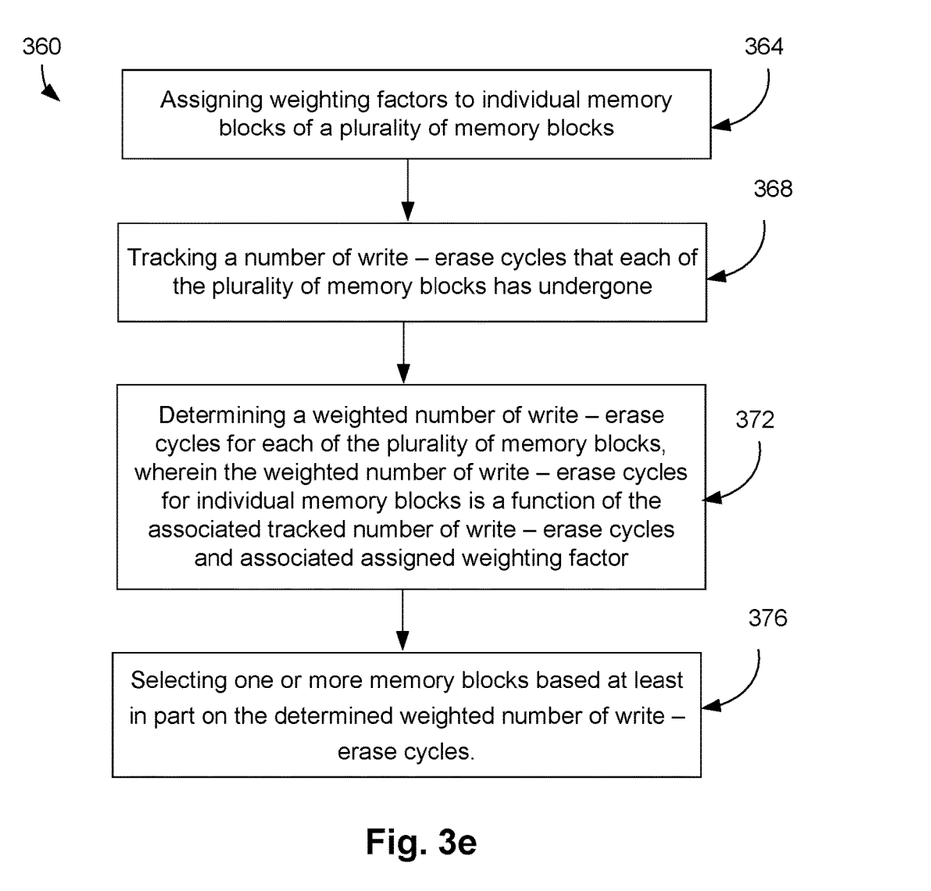
FIG. 3e illustrates another exemplary method for selecting one or more memory blocks into which data will be written.

FIG. 3e illustrates another exemplary method 360 for selecting one or more memory blocks into which data will be written. In an embodiment, the method 360 includes, at block 364, assigning weighting factors to individual memory blocks of the plurality of memory blocks, based at least in part on a type of the memory block—e.g., whether the memory block is an SLC memory block or an MLC memory block, as illustrated in the wear—leveling tables 304b and 304c of FIGS. 3b and 3c, respectively. The method 360 further includes, at block 368, tracking a number of write-erase cycles that each of the plurality of memory blocks has undergone.

The method 320 further includes, at block 372, determining a weighted number of write-erase cycles for each of the plurality of memory blocks, wherein the weighted number of write-erase cycles for individual memory blocks is a function of the associated tracked number of write-erase cycles and associated assigned weighting factor. For example, the weighted number of write-erase cycles for individual memory blocks may be determined by multiplying the tracked number of write-erase cycles with the assigned weighting factor for the memory block.

The method 320 further includes, at block 376, selecting of one or more memory blocks based at least in part on the determined weighted number of write-erase cycles. For example, memory blocks with a relatively lower number of weighted number of write-erase cycles may be given preference over memory blocks with a relatively higher number of weighted number of write-erase cycles, while performing such selection.

Cache System for Mixed SLC/MLS Storage

A cache memory is typically used to bridge main memory and one or more processing cores, and is used to speed up data transfers and instruction execution. The cache is usually faster than main memory, and allows instructions to be executed and data to be read and written at a relatively higher speed.

Figure 4A:
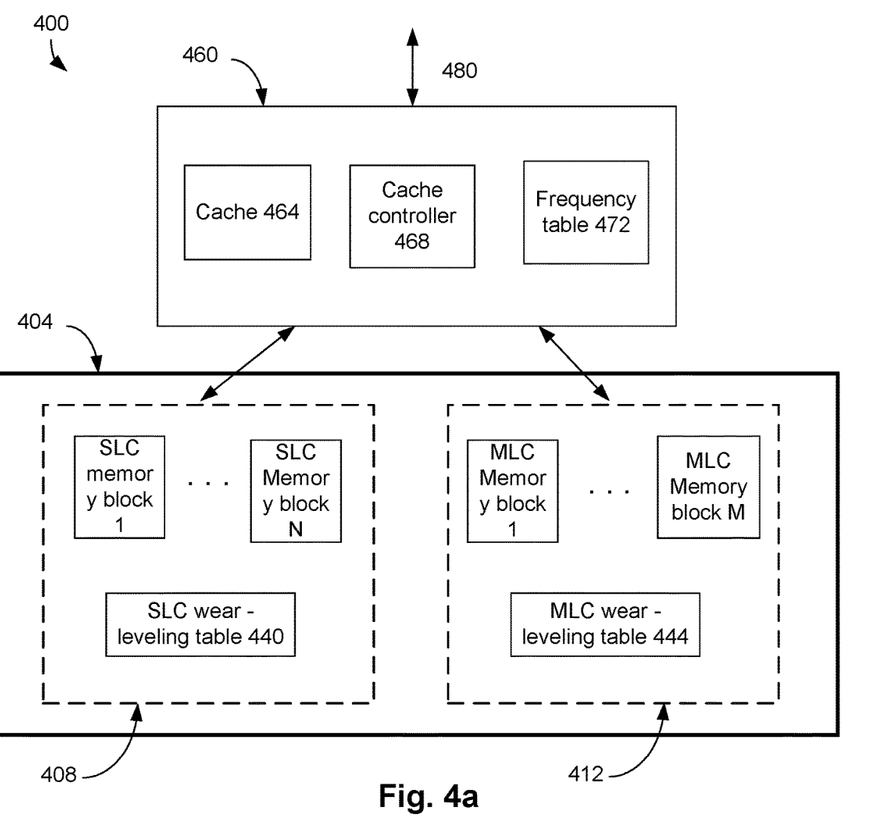
FIG. 4a schematically illustrates an exemplary computing system that includes a cache system configured to be operatively coupled to a memory module.

FIG. 4a schematically illustrates an exemplary computing system 400 that includes a cache system 460 configured to be operatively coupled to a memory module 404. Although not illustrated in FIG. 4a, the cache system 460 is also operatively coupled to one or more processing cores through link 480. The cache system 460 includes cache memory 464 and a cache controller 468 configured to control one or more operations of the cache system 460. The cache system 460 also includes a frequency table 472, which will be discussed in detail herein.

In an embodiment, the memory module 404 includes an SLC memory module 408 and an MLC memory module 412. The SLC memory module 408 includes an SLC wear-leveling table 440 and plurality of SLC memory blocks 1, . . . , N, wherein each SLC memory block includes a plurality of SLC cells. The MLC memory module 412 includes an MLC wear-leveling table 444 and a plurality of MLC memory blocks 1, . . . , M, wherein each MLC memory block includes a plurality of MLC cells. Thus, the memory module 404 comprises a plurality of memory blocks, wherein each memory block of the plurality of memory blocks is either an SLC memory block or an MLC memory block. The cache system 460 is configured to be operatively coupled to the SLC memory module 408 and to the MLC memory module 412.

In an embodiment, the cache system 460 receives data from one or more processing cores over link 480, from the memory module 404, or from any other appropriate source. The cache system 480 writes data to one or more memory cells of the memory module 404 and/or updates data stored in one or more memory cells of the memory module 404. The updating of data stored in the memory module 404, by the cache system 460, may be based at least in part on processing of data by one or more processing cores operatively coupled to the cache system over link 480.

Data stored in the memory module 404 and possibly updated by the cache system 460 may include data associated with an operating system, one or more programs, user files frequently updated by a user of the computing system 400 (e.g., a Microsoft® word file, excel file, etc.), or any other appropriate type of data. While data of a few types stored in the memory module 404 may need frequent updating by the cache system 460, data of other types may not be frequently updated by the cache system 460. For example, data associated with an operating system (OS) may be stored in the memory module 404 and may rarely change. Accordingly, the operating system data may not often be updated by the cache system 460. On the other hand, data associated with a user changeable file (e.g., a Microsoft® word file) may need frequent updating, where the file changes each time the user updates the file.

For the purpose of this disclosure and unless otherwise stated, an "information unit" refers to a group of data bits (e.g., 4, 8, 16, 32 or any other appropriate number of data bits) that are collectively stored in the memory module 404 and possibly collectively updated by the cache system 480. For example, an information unit may comprise data associated with an operating system, that are stored in one or more memory cells of a memory block in the memory module 404. In another example, an information unit may comprise data associated with a program file that is stored in one or more memory cells of another memory block in the memory module 404. Data bits may be grouped to form an information unit based on one or more appropriate factors (e.g., data bits associated with a single file may be grouped to form an information unit). An information unit may be, for example, associated with an operating system file, a program file, a user changeable file, a system file, or the like. The inventive principles of this disclosure are not limited to or based on how individual information units are formed.

Figure 4B:
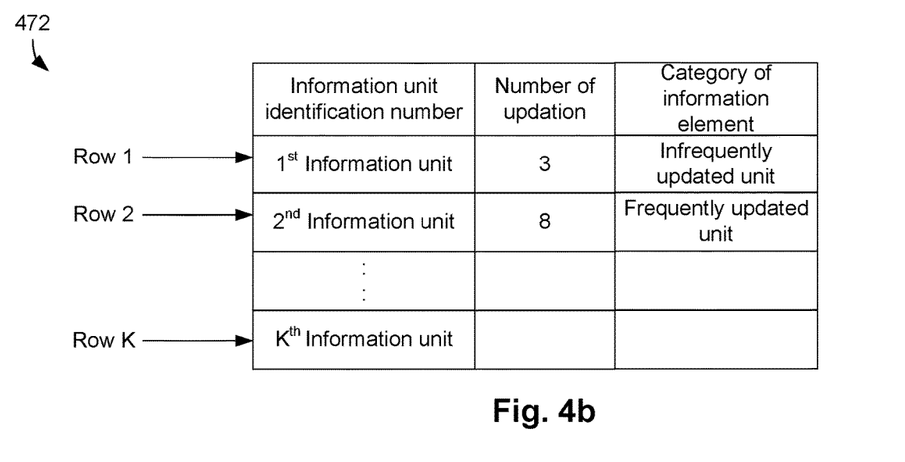

FIG. 4b illustrates an exemplary frequency table 472 included in the cache system 460 of FIG. 4a. Each row of the frequency table 472 is associated with an information unit stored in the memory module 404, and includes an identification number of the information unit. Further details of the frequency table 472 will be discussed in more detail herein.

Figure 5:
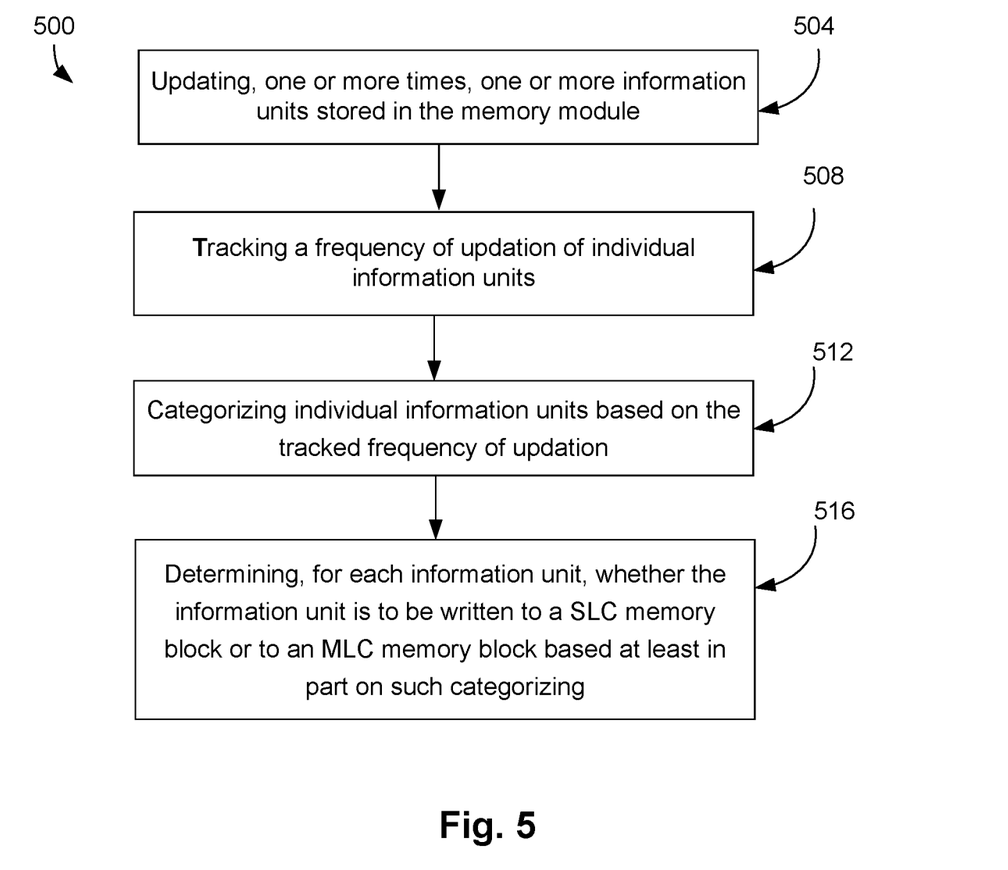

FIG. 5 illustrates an exemplary method 500 for operating a computing system (e.g., the computing system 400 of FIG. 4a). In an embodiment, one or more operations associated with the method 500 is performed by the cache system 460 (e.g., by the cache controller 468).

In an embodiment, the method 500 includes, at block 504, periodically updating, by the cache system 460, one or more information units stored in the memory module 404. For example, a first information unit is associated with an operating system and is stored in a first memory block of the module 404, and a second information unit is associated with a user changeable file and is stored in a second memory block of the memory module 404. Also, the cache system 460 updates the first information unit, for example, during $1^{st}$, $229^{th}$, and $299^{th}$ clock cycles, and updates the second information unit, for example, during $3^{rd}$, $40^{th}$, $78^{th}$, $100^{th}$, $129^{th}$, $200^{th}$, $289^{th}$, and $300^{th}$ clock cycles. The clock cycle numbers discussed throughout this disclosure are purely exemplary in nature.

The method 500 further includes, at block 508, tracking a frequency of updating of individual information units. For example, individual rows of the frequency table 472 of FIGS. 4a and 4b are updated with the frequency of updating of associated information units. The frequency table 472 may keep track of how many times an information unit has been updated, for example, in the last 300 clock cycles. As discussed previously, the first information unit may be updated 3 times and the second information unit may be updated 8 times during the last 300 clock cycles. The frequency table 472 keeps track of these numbers.

The method 500 further includes, at block 512, categorizing individual information units based on the tracked frequency of updating. For example, any information unit updated less than a threshold number (e.g., 4 times) in the last 300 clock cycles is categorized as an infrequently updated information unit, whereas any information unit updated more than the threshold number in the last 300 clock cycles is categorized as a frequently updated information unit. Thus, the first information unit is categorized as infrequently updated information unit, whereas the second information unit is categorized as a frequently updated information unit. The discussed categorization criterion (including the threshold number of 4 times) is purely exemplary in nature, and any other categorization criterion may be used. For example, the categorization criterion may be dynamic or adaptive in nature. That is, if for a given threshold number a very large number (e.g., larger than a capacity of the SLC memory blocks) of information units are categorized as frequently updated information units, then the threshold number may be dynamically changed (e.g., increased) so that a relatively smaller number of information units are categorized as frequently updated information units. Any other appropriate categorization criterion may also be used. In an embodiment, individual rows of frequency table 472 keep track of the category of the associated information unit, as illustrated in FIG. 4*b*.

The cache controller 468, in essence, tries to predict a frequency of updating of each of the one or more information units in, for example, the next few clock cycles based on the past updating behavior of the information units. That is, the prediction is based on tracking the frequency of updating of the information units in the past.

As discussed, a frequently updated information unit is updated relatively more frequently. If a frequently updated information unit is stored in one of the MLC memory blocks of FIG. 4*a*, the MLC memory blocks may undergo frequent write-erase cycles, thereby rapidly decreasing the lifetime of the MLC memory block. As an SLC memory block usually withstands more write-erase cycles compared to an MLC memory block, it may be desirable to store frequently updated information units in SLC memory blocks, rather than storing them in MLC memory blocks. On the other hand, storing an infrequently updated information unit in an MLC memory block may not significantly adversely affect the lifetime of the MLC memory block.

Referring again to FIG. 5, the method 500 further includes, at block 516, determining for each information unit, whether the information unit is to be written to an SLC memory block or to an MLC memory block based at least in part on the categorizing the information unit at block 512. For example, an infrequently updated information unit is written to one of the MLC memory blocks. If the infrequently updated information unit is already stored in one of the MLC memory blocks, then the storage place of the information unit is not changed. However, if the infrequently updated information unit is stored in one of the SLC memory blocks, then the cache controller 468, for example, transmits a request to the memory module 404 to store the information unit in one of the MLC memory blocks. Alternatively (or in addition), the cache controller 468, for example, transmits the updated information unit to the MLC memory module 408 for storage in one of the MLC memory blocks. That is, in an embodiment, the information unit may be stored in one of the MLC memory blocks while the information unit is being updated, while an older (e.g., un-updated) version of the information unit stored in one of the SLC memory blocks may be erased.

Similarly, a frequently updated information unit is written to one of the SLC memory blocks. If the frequently updated information unit is already stored in one of the SLC memory blocks, then the storage place of the information unit is not changed. However, if the frequently updated information unit is stored in one of the MLC memory blocks, then the cache controller 468, for example, transmits a request to the memory module 404 to store the information unit in one of the SLC memory blocks while updating the information unit. Alternatively (or in addition), the cache controller 468, for example, transmits the updated information unit to the SLC memory module 412 for storage in one of the SLC memory blocks.

In an embodiment, once the cache system 460 requests the memory module 404 to write an information unit in one of the SLC memory blocks, the SLC wear-leveling table 440 determines to which one of the SLC memory blocks the information unit is to be written. That is, in an embodiment, the SLC wear-leveling table 440 ensures that data is almost evenly distributed across all the SLC memory blocks. Similarly, the MLC wear-leveling table 444 ensures that data is almost evenly distributed across all the MLC memory blocks.

Operating System for Mixed SLC/MLS Storage

Figure 6:
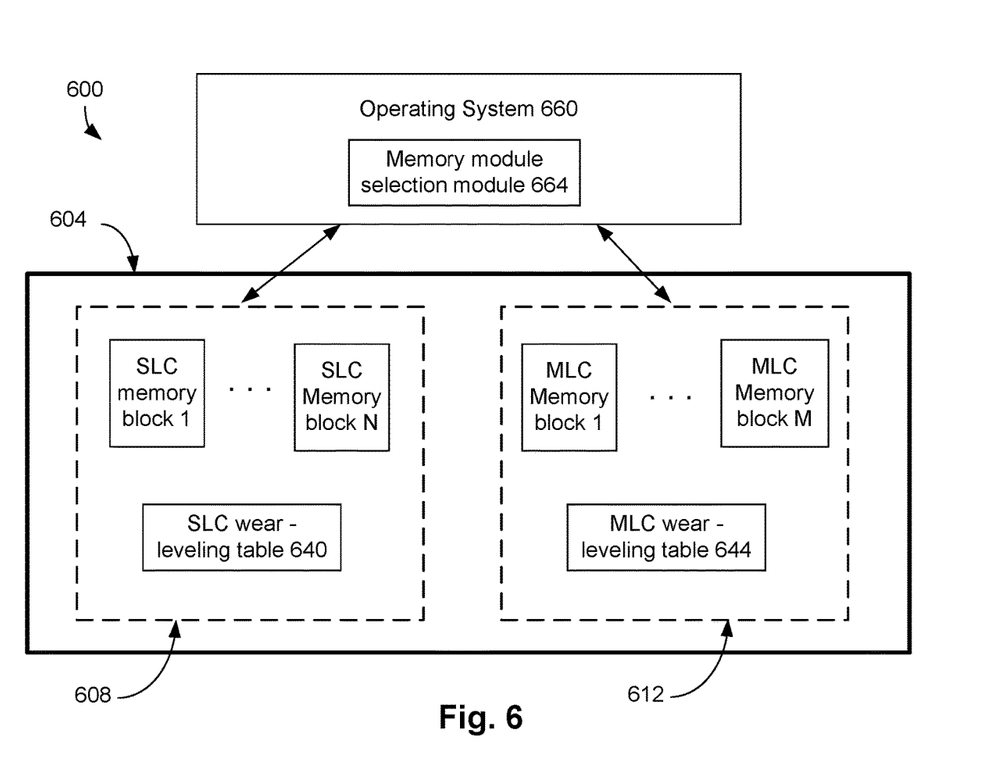
FIG. 6 schematically illustrates an exemplary computing system that includes an operating system configured to be operatively coupled to a memory module.

FIG. 6 schematically illustrates an exemplary computing system 600 that includes an operating system 660 configured to be operatively coupled to a memory module 604. Although not illustrated in FIG. 4*a*, the operating system 660 is operatively coupled to the memory module 404 through one or more system elements, e.g., a cache system, etc.

In an embodiment, the memory module 604 includes an SLC memory module 608 and an MLC memory module 612. The SLC memory module 608 includes an SLC wear-leveling table 640 and plurality of SLC memory blocks 1, . . . , N, wherein each SLC memory block includes a plurality of SLC cells. The MLC memory module 608 includes an MLC wear-leveling table 640 and a plurality of MLC memory blocks 1, . . . , M, wherein each MLC memory block includes a plurality of MLC cells. Thus, the memory module 604 comprises of a plurality of memory blocks, wherein each memory block of plurality of memory blocks is either a single-level cell (SLC) memory block or a multi-level cell (MLC) memory block. The operating system 660 is configured to be operatively coupled to the SLC memory module 608 and to the MLC memory module 612. In an embodiment, the operating system 660 also includes a memory module selection module 664.

In an embodiment, the operating system 660 has knowledge of or may predict a frequency of updating of one or more information units stored (or to be stored) in the memory module 604. For example, the operating system 660 has information about one or more information units, e.g., whether an information unit is associated with the operating system 660, a program file, a user defined or user changeable file, or the like, and the operating system 660 uses these information to predict the frequency of updating of the one or more information units. Based on such prediction, the operating system 660 categorizes each information unit as either frequently updated information unit or infrequently updated information unit. In addition or alternatively, the operating system 660 may also categorize each information unit as either frequently updated information unit or infrequently updated information unit, based on past updating frequency of the information unit. Subsequently, the operating system 660 determines, for each information unit, whether the information unit is to be written to an SLC memory block or to an MLC memory block based at least in part on such categorizing.

Figure 7:
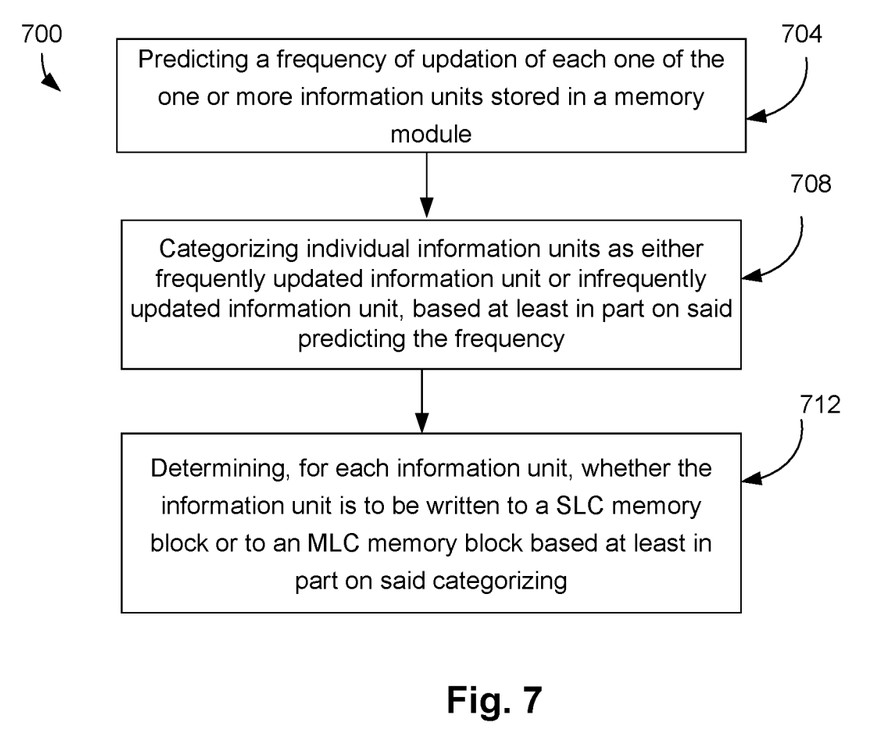
FIG. 7 illustrates an exemplary method for operating the system of FIG. 4a and/or system of FIG. 6.

FIG. 7 illustrates an exemplary method 700 for operating a computing system (e.g., the computing system 400 of FIG. 4a and/or computing system 600 of FIG. 6). In an embodiment, the method 700 includes, at block 704, predicting a frequency of updating of each one of the one or more information units stored in a memory module, wherein the memory module comprises a plurality of memory blocks, and wherein each memory block of plurality of memory blocks is either a single-level cell (SLC) memory block or a multi-level cell (MLC) memory block. For example, the operating system 660 of FIG. 6 performs such prediction based at least in part on information available with the operating system about the one or more information units. In another example, the cache system 460 (e.g., the cache controller 468) of FIG. 4a updates one or more times the one or more information units, tracks a frequency of updating of individual information units, and predicts the frequency of updating based at least in part on such tracking the frequency of updating.

The method 700 further includes, at block 708, categorizing individual information units as either frequently updated information unit or infrequently updated information unit, based at least in part on such prediction of the frequency. Such categorization is performed by the operating system 660 of FIG. 6 and/or by the cache controller 648 of FIG. 7.

The method 700 further includes, at block 712, determining, for each information unit, whether the information unit is to be written to an SLC memory block or to an MLC memory block based at least in part on such categorizing. Such determination is performed by the operating system 660 of FIG. 6 and/or by the cache controller 648 of FIG. 7.

Exemplary Computing System

Figure 8:
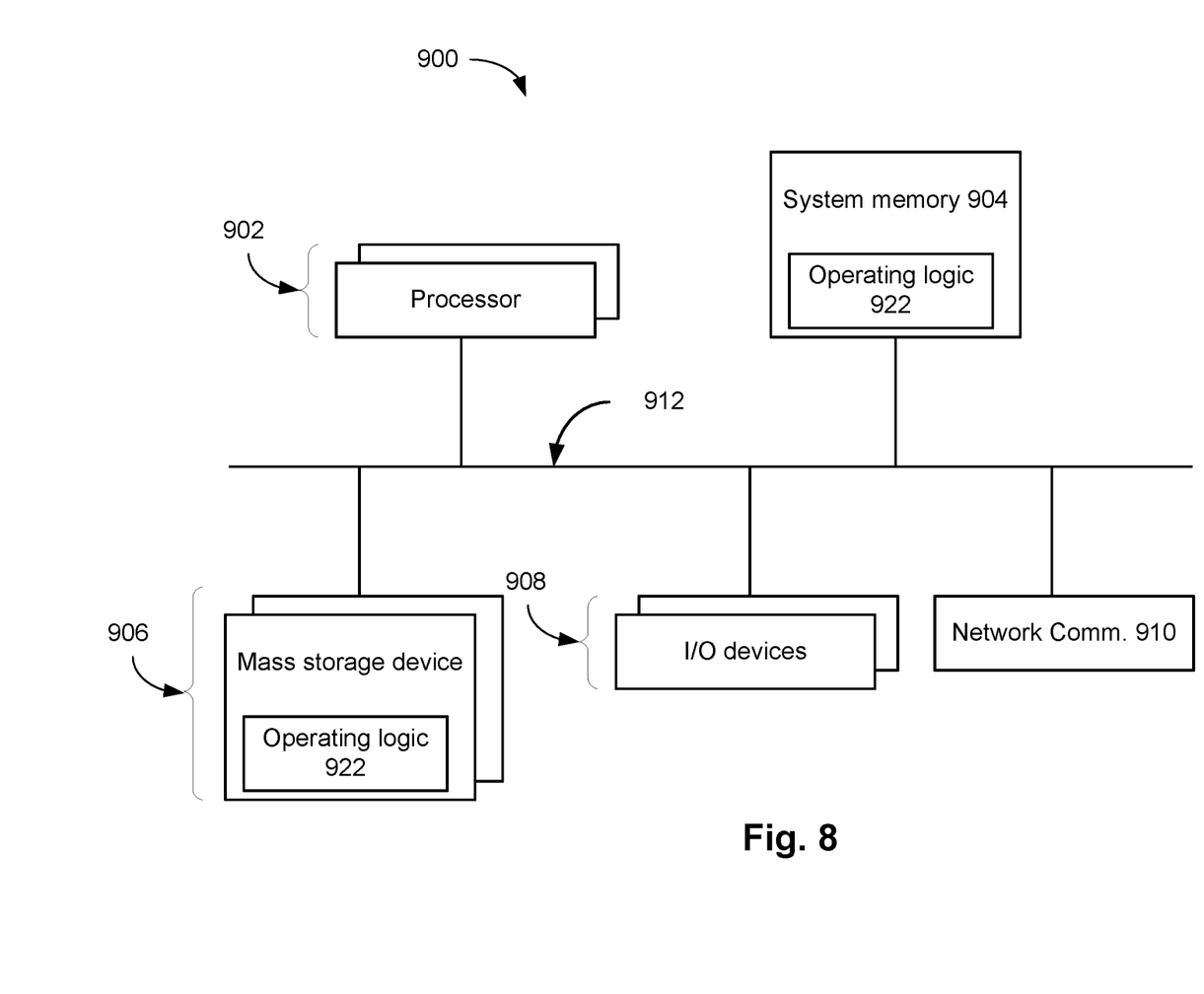
FIG. 8 is a block diagram of an exemplary system.

FIG. 8 is a block diagram of an exemplary system 900. As illustrated, system 900 includes one or more processors or processor cores 902, and system memory 904. For the purpose of this application, including the claims, the terms "processor" and "processor cores" may be considered synonymous, unless the context clearly requires otherwise. Additionally, system 900 includes one or more mass storage devices 906 (such as diskette, hard drive, compact disc read only memory (CDROM) and so forth), input/output devices 908 and communication interfaces 910 (such as network interface cards, modems and so forth). The elements of FIG. 8 are operatively coupled to each other via a system bus 912, which may represent one or more buses. In the case of multiple buses, the multiple buses may be bridged by one or more bus bridges (not illustrated).

Each of these elements performs its conventional functions known in the art. In particular, system memory 904 and mass storage 906 may be employed to store a working copy and a permanent copy of the programming instructions implementing all or a portion of earlier described functions, herein collectively denoted as 922. The instructions 922 may be assembler instructions supported by processor(s) 902 or instructions that can be compiled from high level languages, such as C.

The permanent copy of the programming instructions may be placed into permanent storage 906 in the factory, or in the field, through, for example, a distribution medium (not shown), such as a compact disc (CD), or through communication interface 910 (from a distribution server (not shown)). That is, one or more distribution media having instructions 922 may be employed to distribute the instructions 922 and program various client devices. The constitution of these elements 902-912 are generally well known, and accordingly will not be further described.

In an embodiment, the system memory 904 is similar to of one or more of the memory modules discussed in this disclosure. Thus, the system memory 904 includes one or more MLC memory blocks and one or more SLC memory blocks. The system memory 904 also includes a wear—leveling table that tracks a weighted number of write-erase cycles for each of the plurality of memory blocks, and allocates data to one or more of the plurality of the memory blocks based at least in part on the determined weighted number of write-erase cycles, as discussed with respect to FIGS. 3a-3d.

In an embodiment, the system memory 904 is operatively coupled to a cache system (not illustrated in FIG. 8), wherein the cache system categorizes individual information units stored in the system memory 904 based on a tracked frequency of updating of the information units, and determines, for each information unit, whether the information unit is to be written to an SLC memory block or to an MLC memory block.

In an embodiment, a operating system is associated with the system 900, and the operating system predicts a frequency of updating of each one of the one or more information units stored in a memory module, categorizes individual information units as either frequently updated information unit or infrequently updated information unit, based at least in part on such predicting the frequency, and determines, for each information unit, whether the information unit is to be written to an SLC memory block or to an MLC memory block based at least in part on such categorizing. In an embodiment, the operating logic 922 includes one or more instructions for controlling one or more operations of the memory module and the cache controller.

Although specific embodiments have been illustrated and described herein, a wide variety of alternate and/or equivalent implementations may be substituted for the specific embodiment illustrated and described without departing from the scope of the present invention. This present invention covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In addition, types of memory that may be implemented within one or more embodiments include for example, Flash, EEPROM, EPROM, nano-crystal non-volatile memory, and the like. In particular, it is contemplated that any or all of the disclosed hardware, software, and/or firmware components could be embodied exclusively in hardware, exclusively in software, exclusively in firmware or in some combination of hardware, software, and/or firmware. This application is intended to cover any adaptations or variations of the embodiment discussed herein.

What is claimed is:

1. A method of programming a memory having at least a first memory block and a second block, the method comprising:
assigning (i) a first weighting factor to the first memory block and (ii) a second weighting factor to the second memory block, the first weighting factor being different from the second weighting factor;
tracking (i) a first number of write-erase cycles that the first memory block undergoes and (ii) a second number of write-erase cycles that the second memory block undergoes;
receiving data to be written to the memory;
based on (i) the first weighting factor assigned to the first memory block, (ii) the second weighting factor assigned to the second memory block, (iii) the first number of write-erase cycles that the first memory block undergoes, and (iv) the second number of write-erase cycles that the second memory block undergoes, selecting one of the first memory block or the second memory block; and
writing the data to the selected one of the first memory block or the second memory block.

2. The method of claim 1, wherein selecting one of the first memory block or the second memory block comprises:
based on (i) the first weighting factor assigned to the first memory block and (ii) the first number of write-erase cycles that the first memory block undergoes, determining a first weighted number of write-erase cycles for the first memory block;
based on (i) the second weighting factor assigned to the second memory block and (ii) the second number of write-erase cycles that the second memory block undergoes, determining a second weighted number of write-erase cycles for the second memory block; and
based on (i) the first weighted number of write-erase cycles for the first memory block and (ii) the second weighted number of write-erase cycles for the second memory block, selecting one of the first memory block or the second memory block.

3. The method of claim 1, wherein selecting one of the first memory block or the second memory block further comprises:
determining that the first weighted number of write-erase cycles for the first memory block is less than the second weighted number of write-erase cycles for the second memory block; and
based on determining that the first weighted number of write-erase cycles for the first memory block is less than the second weighted number of write-erase cycles for the second memory block, selecting the first memory block.

4. The method of claim 1, wherein determining the first weighted number of write-erase cycles for the first memory block comprises:
determining the first weighted number of write-erase cycles for the first memory block to be based on a multiple of (i) the first weighting factor assigned to the first memory block and (ii) the first number of write-erase cycles that the first memory block undergoes.

5. The method of claim 1, wherein the first memory block is configured to withstand higher number of write-erase cycles compared to the second memory block, and wherein assigning the first weighting factor and the second weighting factor comprises:
in response to the first memory block being configured to withstand higher number of write-erase cycles compared to the second memory block, assigning the first weighting factor and the second weighting factor such that the first weighting factor is less than the second weighting factor.

6. The method of claim 1, wherein:
the first memory block is a single-level cell (SLC) memory block;
the second memory block is a multi-level cell (MLC) memory block; and
the first weighting factor is less than the second weighting factor.

7. The method of claim 1, wherein:
the first memory block is of a first type;
the second memory block is of a second type;
memory blocks of the first type, on average, withstand higher number of write-erase cycles than memory blocks of the second type, on average, withstand; and
assigning the first weighting factor and the second weighting factor comprises:
in response to the memory blocks of the first type, on average, withstanding higher number of write-erase cycles than memory blocks of the second type, assigning the first weighting factor and the second weighting factor such that the first weighting factor is less than the second weighting factor.

8. The method of claim 1, wherein:
the memory comprises a first plurality of memory blocks and a second plurality of memory blocks, the first plurality of memory blocks including the first memory bock, and the second plurality of memory blocks including the second memory bock;
each of the first plurality of memory blocks is of a first type;
each of the second plurality of memory blocks is of a second type, the second type being different from the first type; and
the method further comprises:
assigning, to each memory block of the first plurality of memory blocks, the first weighting factor,
assigning, to each memory block of the second plurality of memory blocks, the second weighting factor,
based on the first weighting factor and the second weighting factor, selecting a third memory block from the first and second plurality of memory blocks for writing additional data, and
writing the additional data in the third memory block.

9. The method of claim 8, wherein:
each memory block of the first plurality of memory blocks is a single-level cell (SLC) memory block;
each memory block of the second plurality of memory blocks is a multi-level cell (MLC) memory block; and
the first weighting factor is less than the second weighting factor.

10. The method of claim 1, wherein the memory is a flash memory.

11. A memory system comprising:
a memory comprising a first memory block and a second block; and
a memory controller configured to:
assign (i) a first weighting factor to the first memory block and (ii) a second weighting factor to the second memory block, the first weighting factor being different from the second weighting factor,
track (i) a first number of write-erase cycles that the first memory block undergoes and (ii) a second number of write-erase cycles that the second memory block undergoes, based on (i) the first weighting factor assigned to the first memory block, (ii) the second weighting factor assigned to the second memory block, (iii) the first number of write-erase cycles that the first memory block undergoes, and (iv) the second number of write-erase cycles that the second memory block undergoes, select one of the first memory block or the second memory block, and facilitate writing data to the selected one of the first memory block or the second memory block.

12. The memory system of claim 11, wherein the memory controller is configured to select one of the first memory block or the second memory block by:

based on (i) the first weighting factor assigned to the first memory block and (ii) the first number of write-erase cycles that the first memory block undergoes, determining a first weighted number of write-erase cycles for the first memory block;

based on (i) the second weighting factor assigned to the second memory block and (ii) the second number of write-erase cycles that the second memory block undergoes, determining a second weighted number of write-erase cycles for the second memory block; and based on (i) the first weighted number of write-erase cycles for the first memory block and (ii) the second weighted number of write-erase cycles for the second memory block, selecting one of the first memory block or the second memory block.

13. The memory system of claim 11, wherein the memory controller is further configured to select one of the first memory block or the second memory block by:

determining that the first weighted number of write-erase cycles for the first memory block is less than the second weighted number of write-erase cycles for the second memory block; and based on determining that the first weighted number of write-erase cycles for the first memory block is less than the second weighted number of write-erase cycles for the second memory block, selecting the first memory block.

14. The memory system of claim 11, wherein the memory controller is configured to determine the first weighted number of write-erase cycles for the first memory block by:

determining the first weighted number of write-erase cycles for the first memory block to be based on a multiple of (i) the first weighting factor assigned to the first memory block and (ii) the first number of write-erase cycles that the first memory block undergoes.

15. The memory system of claim 11, wherein the first memory block is configured to withstand higher number of write-erase cycles compared to the second memory block, and wherein the memory controller is configured to assign the first weighting factor and the second weighting factor by:

in response to the first memory block being configured to withstand higher number of write-erase cycles compared to the second memory block, assigning the first weighting factor and the second weighting factor such that the first weighting factor is less than the second weighting factor.

16. The memory system of claim 11, wherein:

the first memory block is a single-level cell (SLC) memory block;

the second memory block is a multi-level cell (MLC) memory block; and the first weighting factor is less than the second weighting factor.

17. The memory system of claim 11, wherein:

the first memory block is of a first type;

the second memory block is of a second type;

memory blocks of the first type, on average, withstand higher number of write-erase cycles than memory blocks of the second type, on average, withstand; and the memory controller is configured to assign the first weighting factor and the second weighting factor by:

in response to the memory blocks of the first type, on average, withstanding higher number of write-erase cycles than memory blocks of the second type, assigning the first weighting factor and the second weighting factor such that the first weighting factor is less than the second weighting factor.

18. The memory system of claim 11, wherein:

the memory comprises a first plurality of memory blocks and a second plurality of memory blocks, the first plurality of memory blocks including the first memory bock, and the second plurality of memory blocks including the second memory bock;

each of the first plurality of memory blocks is of a first type;

each of the second plurality of memory blocks is of a second type, the second type being different from the first type; and the memory controller is further configured to:

assign, to each memory block of the first plurality of memory blocks, the first weighting factor, assign, to each memory block of the second plurality of memory blocks, the second weighting factor, based on the first weighting factor and the second weighting factor, select a third memory block from the first and second plurality of memory blocks for writing additional data, and facilitate writing the additional data in the third memory block.

19. The memory system of claim 18, wherein:

each memory block of the first plurality of memory blocks is a single-level cell (SLC) memory block;

each memory block of the second plurality of memory blocks is a multi-level cell (MLC) memory block; and the first weighting factor is less than the second weighting factor.

20. The memory system of claim 11, wherein the memory is a flash memory.

* * * * *